(12) United States Patent
Marciante et al.

(10) Patent No.: US 8,044,655 B2
(45) Date of Patent: Oct. 25, 2011

(54) PULSE MEASUREMENT APPARATUS AND METHOD

(75) Inventors: John R. Marciante, Webster, NY (US); William R. Donaldson, Pittsford, NY (US); Richard G. Roides, Scottsville, NY (US)

(73) Assignee: University of Rochester, Rochester, NY (US)

( * ) Notice: Subject to any disclaimer, the term of this patent is extended or adjusted under 35 U.S.C. 154(b) by 143 days.

(21) Appl. No.: 12/114,956

(22) Filed: May 5, 2008

(65) Prior Publication Data

US 2009/0072811 A1 Mar. 19, 2009

Related U.S. Application Data

(60) Provisional application No. 60/916,059, filed on May 4, 2007.

(51) Int. Cl.
*G01R 23/16* (2006.01)
(52) U.S. Cl. .................. 324/76.12; 324/76.77; 324/710
(58) Field of Classification Search ................ 324/76.12
See application file for complete search history.

(56) References Cited

U.S. PATENT DOCUMENTS

| | | | | |
|---|---|---|---|---|
| 4,345,212 | A * | 8/1982 | Seppala et al. | 359/349 |
| 5,831,752 | A * | 11/1998 | Cotter et al. | 398/54 |
| 7,236,707 | B2 * | 6/2007 | Shahar | 398/140 |
| 2003/0228095 | A1 * | 12/2003 | Hakimi et al. | 385/27 |

OTHER PUBLICATIONS

Wang et al., Optical packet replicator using cascaded SOA-based active fiber ring, IEEE Photonics Tech Letters, V. 21, N. 18, Sep. 15, 2009, p. 1320-1322.*

Kiehl, J.T., et al., Earth's annual global mean energy budget, Bulletin of the Amer. Meterological Soc., 1997, p. 197-209.*
Gerald C. Vogel et al; Picosecond Optical Sampling; IEEE Journal of Quantum Electronics, vol. QE-10, No. 9, Sep. 1974; pp. 642-646.
Kung-Li Deng et al.; Single-Shot Optical Sampling Oscilloscope for Ultrafast Optical Waveforms; IEEE Photonics Technology Letters, vol. 10, No. 3, Mar. 1998; pp. 397-399.
A. Jolly et al.; Static and Synchronized Switching Noise Management of Replicated Optical Pulse Trains; Optics Communication 264 (2006) 89-96; Elsevier B.V.
K.L. Deng et al.; Optical Packet Compressor for Ultra-Fast Packet-Switched Optical Networks; Electronics Letters, Jul. 3, 1997, vol. 33, No. 14; pp. 1237-1239.

* cited by examiner

*Primary Examiner* — Thomas Valone
(74) *Attorney, Agent, or Firm* — William Greener; Bond, Schoeneck & King, PLLC

(57) ABSTRACT

An embodiment of the invention is directed to a pulse measuring system that measures a characteristic of an input pulse under test, particularly the pulse shape of a single-shot, nano-second duration, high shape-contrast optical or electrical pulse. An exemplary system includes a multi-stage, passive pulse replicator, wherein each successive stage introduces a fixed time delay to the input pulse under test, a repetitively-gated electronic sampling apparatus that acquires the pulse train including an entire waveform of each replica pulse, a processor that temporally aligns the replicated pulses, and an averager that temporally averages the replicated pulses to generate the pulse shape of the pulse under test. An embodiment of the invention is directed to a method for measuring an optical or an electrical pulse shape. The method includes the steps of passively replicating the pulse under test with a known time delay, temporally stacking the pulses, and temporally averaging the stacked pulses. An embodiment of the invention is directed to a method for increasing the dynamic range of a pulse measurement by a repetitively-gated electronic sampling device having a rated dynamic range capability, beyond the rated dynamic range of the sampling device; e.g., enhancing the dynamic range of an oscilloscope. The embodied technique can improve the SNR from about 300:1 to 1000:1. A dynamic range enhancement of four to seven bits may be achieved.

29 Claims, 9 Drawing Sheets

PULSE MEASUREMENT APPARATUS AND METHOD

RELATED APPLICATION DATA

This application claims priority to U.S. provisional application Ser. No. 60/916,059 filed on May 4, 2007, the full disclosure of which is incorporated by reference herein in its entirety.

FEDERALLY SPONSORED RESEARCH

This invention was made with government support under Cooperative Agreement No. DE-FC52-92SF19460 sponsored by the U.S. Department of Energy Office of Inertial Confinement Fusion. The government has certain rights in the invention.

BACKGROUND

1. Field of the Invention

Embodiments of the invention are most generally related to the field of signal pulse measurement. More particularly, embodiments of the invention are directed to optical and electrical pulse measurement apparatus and methods.

2. Background Discussion

Nanosecond-length pulses are used in a variety of applications including, but not limited to, e.g., LIDAR, remote sensing, and laser-based inertial confinement fusion (ICF). It is particularly advantageous to be able to accurately measure the pulse shape of high contrast laser pulses used in ICF. Shape contrast refers to the complex temporal shape of an optical pulse. For example, a pulse might rise rapidly to a low, relatively-flat, plateau-region followed by a slow ramp to the peak of the pulse (a Gaussian would not be considered a complex shape). The shape contrast is the ratio of the peak of the pulse to the minimum feature amplitude that must be controlled. Thus the contrast may be considered as the ratio of the peak to the plateau. Alternatively, if the pulse has a sharp spike on the leading edge, followed by a valley and then a ramp up to the peak, the contrast would be considered the peak to valley ratio.

It is known that streak cameras or photodiodes in conjunction with oscilloscopes, for example, can be used for the measurement of nanosecond-length pulses, however, these apparatus and associated measurement techniques have recognized shortcomings. For example, the relatively slow update rate of single-shot, high-dynamic-range streak cameras limits their usefulness in applications that require real-time monitoring. Exemplary ICF applications include real-time pulse shape adjustment and diagnosis of intermittent problems.

The usefulness of oscilloscopes for the measurement of nanosecond-length pulses with picosecond-scale features has been limited by device performance constraints related to, for example, insufficient vertical resolution and/or effective number of bits. These constraints further limit the dynamic range capability for sufficiently measuring high-contrast pulse shapes with the oscilloscope measuring apparatus.

A conventional method for reducing noise on periodic signals involves averaging temporally sequential events. The technique has the advantage of reducing the signal-to-noise ratio (SNR) by a factor of $N^{1/2}$, where N represents the number of sequential events. However, the averaging process tends to wash out the non-repetitive, single-shot events, which becomes particularly important in the attempted diagnosis of intermittent failures. Moreover, acquisition speed in sequential averaging is reduced by a factor of N.

One reported approach to capture single-shot events involves actively replicating the pulse. The gain in an active fiber loop was used to maintain signal amplitude throughout the pulse train, but at the expense of amplifier noise added to the signal at every pass. Furthermore, the amplitudes of the resultant pulse train followed an exponential decay curve, limiting operation at high repetition rates.

Another reported approach to measure single-shot, ultra-fast optical waveforms involves compressing a large bandwidth laser signal and employing a fast optical gate to sample time-varying slices of different temporal portions of a replicated pulse train. This technique is inefficient in that it throws away a significant portion of signal photons in the measurement process.

The inventors have recognized the advantages and benefits associated with improved and new apparatus and methods for pulse measurement that address the shortcomings of currently available measurement apparatus and techniques as discussed herein and as further recognized by those skilled in the art. Moreover, the inventors recognize the advantages of being able to measure both optical and electrical pulses of nano-second duration and, further, the ability to measure pulse signal contrast having a dynamic range that exceeds the rated dynamic range of the particular measuring device.

SUMMARY

An embodiment of the invention is directed to a pulse measuring system that measures a characteristic of an input pulse under test, particularly the pulse shape of a single-shot, nano-second duration, high shape-contrast optical or electrical pulse. An exemplary system includes a multi-stage, passive pulse replicator, wherein each successive stage introduces a fixed time delay to the input pulse under test, a repetitively-gated electronic sampling apparatus that acquires the pulse train including an entire waveform of each replica pulse, a processor that temporally aligns the replicated pulses, and an averager that temporally averages the replicated pulses to generate the pulse shape of the pulse under test. In one aspect, the replicator uses fused-fiber components such as 2×2 fused-fiber splitters. According to an aspect, inter-stage connectors may be provided to add or remove replicator stages as may be desirable. Similarly, commercially available inter-stage switches may be incorporated in order to switch in or out one or more stages without physically removing or adding stages. In alternative aspects, the replicator apparatus may comprise bulk components either in free-space or in fiber-coupled arrangements. In another aspect, pulses may be replicated with free-space optics using shaped or coated surfaces and retro-reflection cavities. According to the embodiments disclosed herein, every pulse replica is sampled at multiple points in time. According to an aspect, the repetitively-gated electronic sampling apparatus is a digital storage oscilloscope that determines sampling time. Alternatively, any repetitively gated electronic sampling system such as a gated integrator, for example, may be used. Advantageously, the bandwidth of the sampling system will come within the limitation of a dynamic range of at least 30 or five effective digitizing levels. In an aspect of the system, the timing of each replica relative to the continuous stream of sampling gates is arbitrary. The exemplary and illustrative embodiments disclosed herein are non-limiting and, as such, do not exclude other passive component configurations. In related aspects in which the pulse under test is an electrical signal pulse, the system further includes a laser source that can generate a laser pulse and a modulator, such that the electrical pulse is converted into an optical pulse with via an electro-optic modulator. The optical pulse then undergoes the time-delayed replication, followed by temporal stacking of the replicas and temporal averaging. According to an exemplary aspect, the electro-optic conversion consists of a laser and a commercial, fiber-optic based Mach-Zehnder polarization rotator. The electrical pulse causes the polarization of the optical pulse to rotate. The temporal shape of the electrical pulse is encoded into the polarization of the light. Passing the light through a polarizer changes the polarization encoding into an intensity encoding. The input electrical pulse shape can then be determined through knowledge of the transfer function of the modulator. According to an aspect, the system may further include a pulse amplifier located between the modulator and the replicator, in which case additional knowledge of the transfer function of the amplifier as well as modulator bias voltage and various attenuation factors will facilitate determination of the input electrical pulse shape. In various aspects, input pulse attenuators may be used to limit input pulse intensities that may damage any of the system components.

An embodiment of the invention is directed to a method for measuring an optical or an electrical pulse shape. In an exemplary aspect the method includes the steps of generating a pulse to be measured; passively replicating the pulse, including, in a first splitting operation, splitting the pulse amplitude into a first part and a second part, delaying one of the first and second parts with respect to the other part by a known temporal duration and recombining the first and second parts; acquiring a resultant pulse train of replicated pulses that further involves acquiring the entire waveform of each replicated pulse; temporally stacking the replicated pulses; temporally aligning the stacked pulses; obtaining an average of the temporally aligned, replicated pulses; and generating an output pulse shape of the pulse under test. Advantageously, the pulse under test will have a pulse length that is less than the minimum separation between the replicated pulses in the pulse train.

An embodiment of the invention is directed to a method for increasing the dynamic range of a pulse measurement by a repetitively-gated electronic sampling device having a rated dynamic range capability, beyond the rated dynamic range of the sampling device; e.g., enhancing the dynamic range of an oscilloscope. According to an exemplary aspect, the method involves the steps of passively time-delay-replicating a pulse to be measured so as to obtain a replicated pulse train, wherein the pulse to be measured has a pulse length that is less than the minimum separation between the replicated pulses in the pulse train; inputting the pulse train to the repetitively-gated electronic sampling device and acquiring it in a digital electronic format; separating and temporally aligning the replica pulses in the pulse train; averaging the temporally aligned replica pulses; and generating an output pulse shape of the pulse under test. According to an exemplary aspect, a dynamic range improvement of up to seven bits may be achieved. According to an aspect, higher bandwidth measurements can be made than with conventional multi-shot averaging techniques. According to an aspect, improved SNR can be realized.

Numerous benefits and advantages will be provided by the disclosed embodiments and their various aspects.

BRIEF DESCRIPTION OF THE DRAWING FIGURES

FIG. 1 schematically shows a 64-pulse passive pulse-stacking architecture according to an exemplary embodiment of the invention;

FIG. 2 schematically shows an oscilloscope trace of the 64 pulse replicas produced by the architecture of FIG. 1;

DETAILED DESCRIPTION OF EMBODIMENTS OF THE INVENTION

Figure 1:
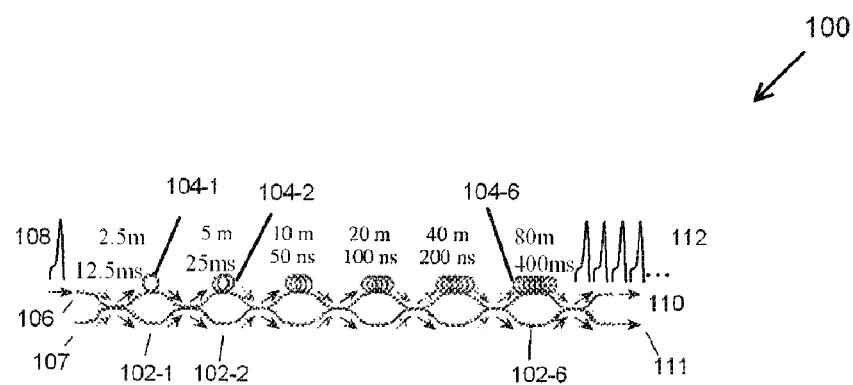

FIG. 1 shows a passive pulse replicator architecture 100 according to an exemplary embodiment of the invention. The replicator 100 includes six 2×2 fused-fiber optical pulse splitter stages $102_1, 102_2, \ldots 102_m$ (m=6), each of which is spliced with an m×12.5 nano-second (ns) delay fiber $104_1, 104_2, \ldots 104_m$. As illustrated, delay fiber $104_1$ has a length of 2.5 meters (m) and provides a delay of 12.5 ns. Thus delay fibers $104_2 \ldots 104_6$ have respective lengths/delay times of 5 m/25 ns, 10 m/50 ns, 20 m/100 ns, 40 m/200 ns, and 80 m/400 ns.

An initial optical pulse 108 is input to input port 106 of the first splitter stage $102_1$ and the output pulse train 112 of 64 output pulses is output at output port 110. At each stage, the signal power is divided and recombined with a fixed time delay. Multiple split/recombine stages $102_m$ with digitally-increasing delay can yield an arbitrary number of pulses, provided there is sufficient energy in the initial pulse. For example, up to $2^{14}$ (16384) pulses could be generated by adding n additional replicator stages $102_n$. It will be appreciated that the single-pulse energy after passing through the system is given by $(\eta/2)^N$, where $\eta$ is the transmission of the coupler and N is the number of stages. Using typical energy limitations associated with the fiber and a conservative 0.6 dB insertion loss for the couplers, a total of 14 stages were calculated and 8 stages were demonstrated according to exemplary embodiments. The replicated pulses are then read from a single oscilloscope trace and subsequently averaged in time in order to achieve increased dynamic range. This technique demonstrated an increase of 7 bits over nominal oscilloscope performance.

As shown in FIG. 1, the first splitter $102_1$ has a second input port 107 that is not used as illustrated; however, two separate pulses could be run simultaneously through the apparatus 100 provided their timing is such that the resultant pulse trains do not overlap in time. That is, the light is delivered to the replicator via optical fibers. The timing of the pulses emerging from the two delivery fibers can be checked with an oscilloscope. If the separation in time of the two pulses ($T_{sep}$) is less than the total temporal length of the output pulse train ($T_{out}$), the pulse trains generated by the individual inputs will overlap at the output. It will then be necessary to add an additional length of optical fiber (e.g., a patchcord) to latest arriving input pulse. The length of the patchcord must be at least $(T_{out}-T_{sep})$ c/n, where c is the speed of light and n is the index of refraction of the fiber. As shown, the last splitter $102_m$ has a second output port 111.

Figure 2:
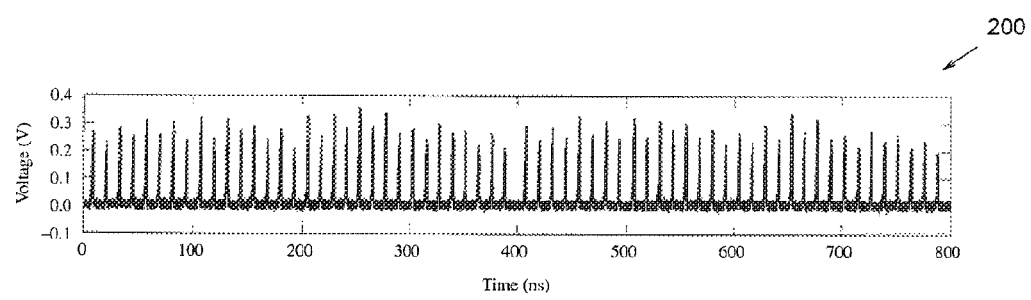

FIG. 2 shows an oscilloscope trace 200 of the resultant pulse train 112 of 64 pulses from the raw photodiode output as measured on a Tektronix® TDS 6154C digital storage oscilloscope, which has a 12 GHz analog bandwidth. The pulses are nominally spaced at 12.5 ns, although precise spacing is not critical to the embodied measurement method as described in detail below.

The trace 200 is acquired from the oscilloscope at 25 ps resolution, and the individual pulses are separated by temporal stacking (binning). The fine temporal alignment can be measured once with a cross-correlation method using the formula $$X_{ij}(t)=F^{-1}[F[P_i(t)] \times F^*[P_j(t)]],$$

where F and $F^{-1}$ denote the discrete fast Fourier transform and its inverse, and the asterisk denotes the complex conjugate. The temporal offset $t_{ij}$ is the value of t that maximizes the function $X_{ij}(t)$. $P_j(t)$ is offset by this amount before averaging with the other pulses from the pulse train 112. Fixed off-sets may also be used if continuous re-alignment is not deemed necessary.

Figure 3:
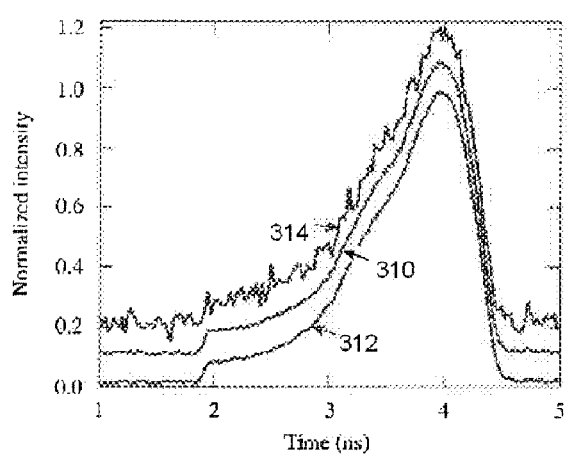
FIG. 3 shows comparative graphs of single-shot, single-shot-averaged, and multi-shot-averaged pulse shapes according to an illustrative embodiment of the invention.

FIG. 3 is a graph that shows a single-shot-self-averaged pulse 310, a multi-shot-averaged pulse (64 averages) 312, and a single-shot pulse (no averaging) 314 for comparison. Similar to the multi-shot average 312, the single shot average 310 shows clear performance enhancement compared to the single-shot case 314. Additionally, due to jitter inherent in temporal acquisitions, the multi-shot-averaged case 312 has a reduced effective bandwidth compared to the single-shot-averaged trace 310, as can be seen in the relative sharpness of the leading edges of the corresponding pulses in the figure.

Figure 4:
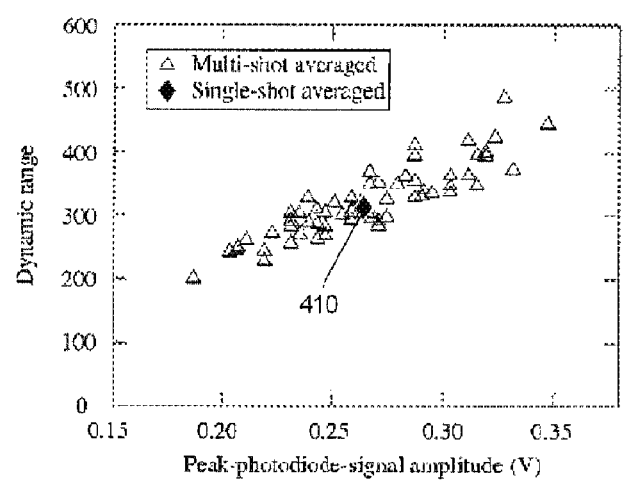
FIG. 4 shows comparative graphical data representing the dynamic range of single-shot-averaged and multi-shot-averaged pulses according to an illustrative embodiment of the invention.

The dynamic range of the measurement is defined as the ratio of the peak of the signal to the signal level where the SNR is equal to unity. FIG. 4 shows the calculated dynamic range for the single-shot and multi-shot averages as a function of the peak signal on the photodiode. In the multi-trace averages, there are 64 temporally displaced copies at different signal amplitudes (as can be seen in FIG. 2), each of which is plotted independently. Given that the noise level is identical for all cases, increased signal amplitude corresponds directly to increased dynamic range. For the single-shot-averaging case, the data point 410 is plotted versus the average amplitude of all of the peaks in the 64 pulse train 112. This plot clearly demonstrates that single-shot averaging works as well as multi-shot averaging without the disadvantages of reduced acquisition time and the loss of single-shot events. For further comparison, the manufacturer specifications rate the oscilloscope at 5.5 ENOB, corresponding to a maximum dynamic range of 45. The single-shot-averaging technique as described in an exemplary aspect herein demonstrates a dynamic range of 312, or an ENOB of 8.3, an improvement of nearly three bits over the nominal performance of the oscilloscope. This level of improvement is expected from the averaging function; since the SNR is reduced by $N^{1/2}$ and the maximum signal remains nearly the same, the dynamic range is improved by the same factor, for which $(64)^{1/2}=23$.

Figure 8:
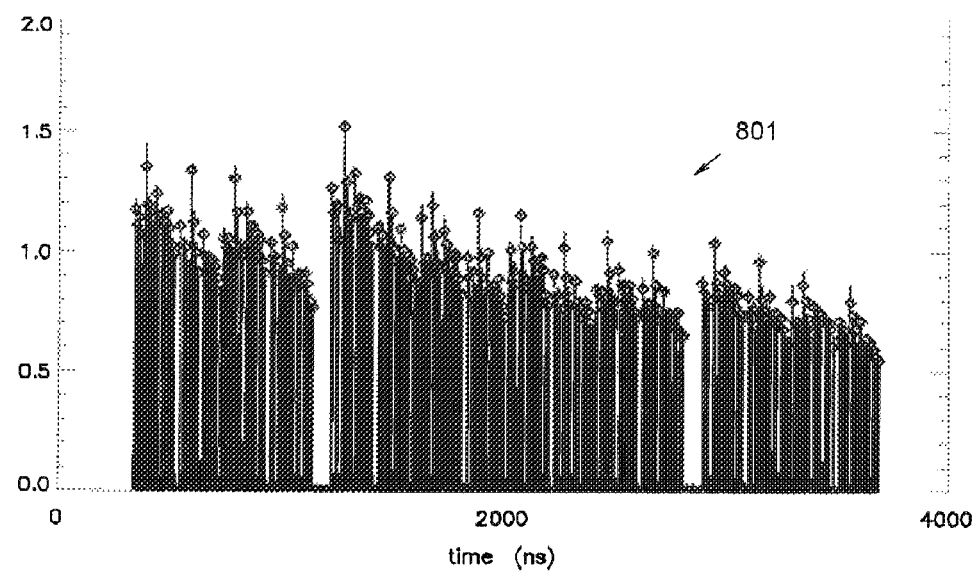
FIG. 8 is a graph that shows the output of a 256-pulse replicator according to an exemplary embodiment of the invention.
Figure 9:
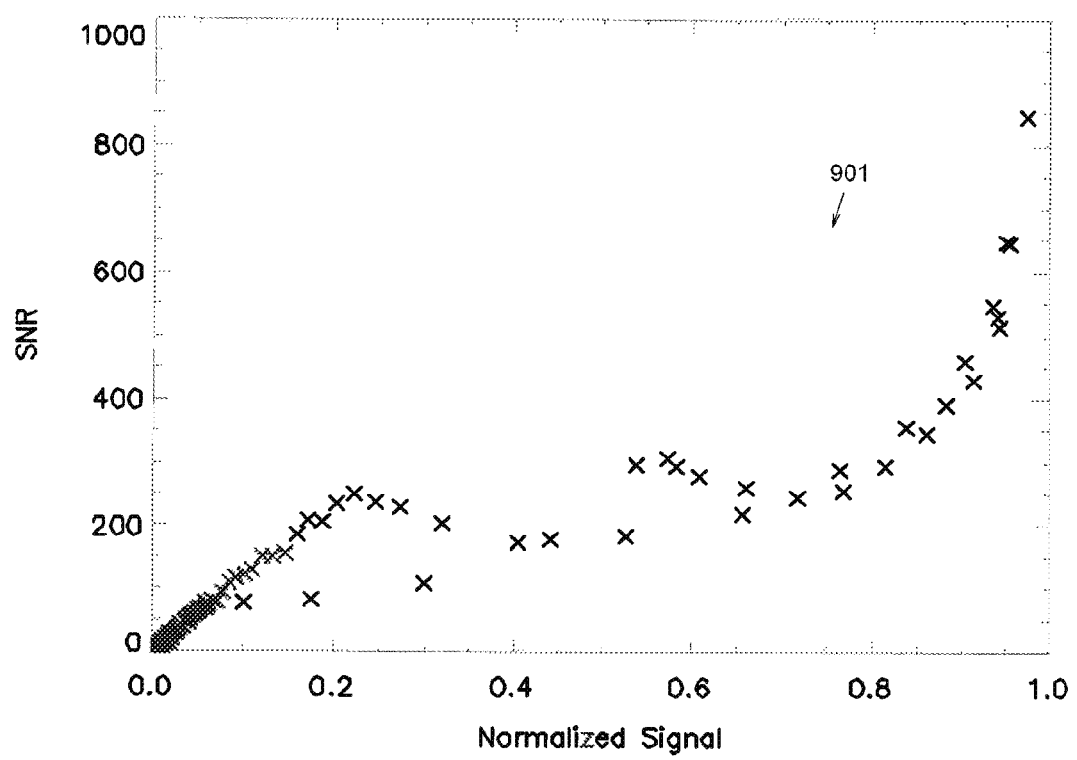
FIG. 9 is a graph that shows a SNR of greater than 850:1 at the peak of the pulse for the 256-pulse replicator of FIG. 8.

In principle, the method embodiment described herein can be extended to a larger number than the exemplary 64 of pulses in the pulse stacker 100, thereby achieving even better dynamic range and SNR. For example, the output 801 of an exemplary 256-pulse replicator, shown in FIG. 8, provided a SNR of 850:1 at the peak of the pulse and 100:1 at the 10% of peak point as illustrated by the graph 901 in FIG. 9. It is believed that the ultimate limitation is peak-detected signal power, which is reduced by a factor of two every time the number of pulses is doubled. Provided the laser system has sufficient energy to spare for the measurement, the upper limitation on launched power is driven by damage and non-linear effects in the fiber. For spectrally narrowband pulses, stimulated Brillouin scattering (SBS) becomes the limiting factor in power launched into the fiber. The conventional threshold equation for the SBS threshold is $$g_B P_0 L_{eff}/A_{eff}=21,$$

where $g_B$ is the Brillouin gain, $P_0$ is the threshold peak power, $L_{eff}$ is the effective interaction length, and $A_{eff}$ is the effective mode area. Since the light scattered by SBS is in the reverse propagation direction, the effective length of the interaction is determined by the time of flight of the pulse in the fiber. Using typical numbers for a 1053 nm input pulse, the SBS energy threshold for a 1 ns pulse is of the order of several microJoules.

Damage thresholds for conventional fibers are near 5 J/cm² for a 1 ns pulse, although higher values have been reported. Using the cited value leads to an upper energy limit of the order of a few microJoules for a single-mode fiber at 1053 nm having an approximately six micron core diameter. Together, damage and SBS considerations limit the maximum launched power to a few microJoules.

The system receiver (sampling component) also has certain limitations. Generally, detection of low light levels may lead to signal-to-noise issues; therefore, higher light levels are advantageous. However, the photodiode of a typical digital storage oscilloscope will have an upper limit of peak signal power before the pulse becomes distorted by space-charge effects that arise when the extracted pulse exceeds more than a few percent of the charge stored in the photodiode. For the Discovery DSC-30 photodiodes that were used in our experiments, the power was limited to approximately 10 pJ per pulse in the pulse train; reasonably beyond that value, pulse-shape distortion may become noticeable. Together, the fiber launch energy and the photodiode linearity will determine the maximum dynamic range of the detected signals.

Figure 5:
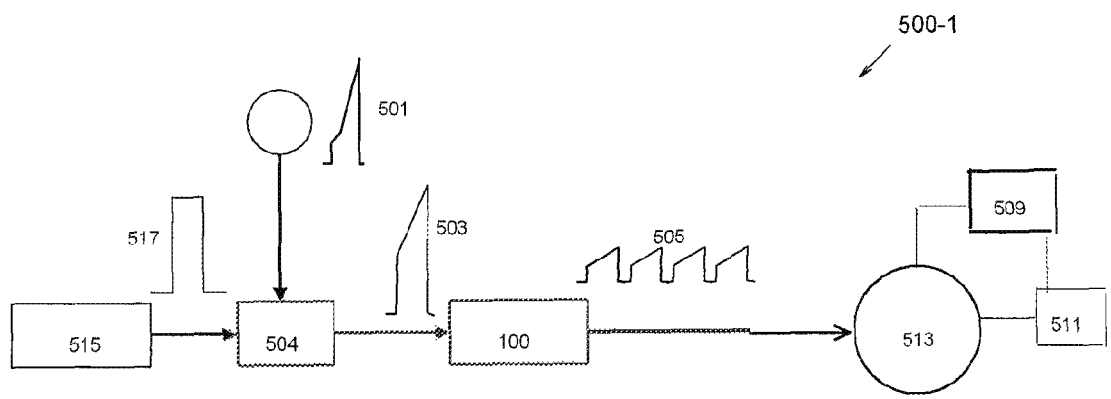
FIG. 5 shows a schematic of a pulse measurement system for measuring an electrical input pulse shape according to an exemplary embodiment of the invention.

According to an aspect of the method embodiment described herein, the technique of passive optical replication can be extended to facilitate measuring an electrical pulse shape with an oscilloscope. As illustrated in FIG. 5, which shows an exemplary pulse measurement system 500-1, an input electrical pulse under test 501 is converted into an optical pulse 503 with an electro-optic modulator 504. The optical pulse 503 then undergoes the time-delayed replication as described herein above in a low loss, passive, fiber-optic replicator 100, followed by temporal stacking of the pulse replicas 505 (via processor 509), and pulse replica averaging (which can be performed by an external averager 511 or by appropriately programming a suitable oscilloscope 513.

The illustrative electro-optic conversion apparatus and method consists of a laser 515 that generates an optical pulse 517, and a commercial, fiber-optic based Mach-Zehnder polarization rotator 504; i.e., modulator. The electrical pulse 501 causes the polarization of the optical pulse 517 to rotate. The temporal shape of the electrical pulse is thus encoded into the polarization of the light. Passing the light through the polarization rotator changes the polarization encoding into an intensity encoding. Since the transfer function of the modulator will be known, the electrical pulse shape can ultimately be determined from the encoded optical pulse 503.

The modulator 504 has a small capacitance, so a small amount of electrical charge can modulate a large number of photons. The transition from an optical to a dual optical/electrical system requires the incorporation of the modulator transfer function into a deconvolution algorithm. The deconvolution is given by the formula:

$$P_o(t) = P_i(t) \times \sin^2(0.5 \times V(t) \times \pi/V_\pi + \phi) \quad (1),$$

where $P_o(t)$ is the time varying optical power out of the modulator, $P_i(t)$ is the optical input power, $V(t)$ is the input voltage, and $V_\pi$ and $\phi$ are constants associated with the modulator. $P_o(t)$ and $P_i(t)$ can be determined accurately by feeding the optical signals into the replicator. As long as $V(t) < V_\pi$ for single polarity pulses and $V(t) < V_\pi/2$ for dual polarity electrical pulses, the voltage determined by inverting equation (1) is unique.

$$V(t) = \{a \sin([P_o(t)/P_i(t)]^{1/2}) - \phi\} \times 2/\pi \times V_\pi \quad (2).$$

If the electro-optic modulation introduced additional noise, that noise would manifest itself in a difference between the sequential and replicated averaging (which we did not observe). The laser 515 was capable of producing a very stable output pulse, which is possible only if the e-o modulation is noise free. Thus we do not expect a degradation in SNR if electrical pulses are measured rather than optical pulses.

Figure 7B:
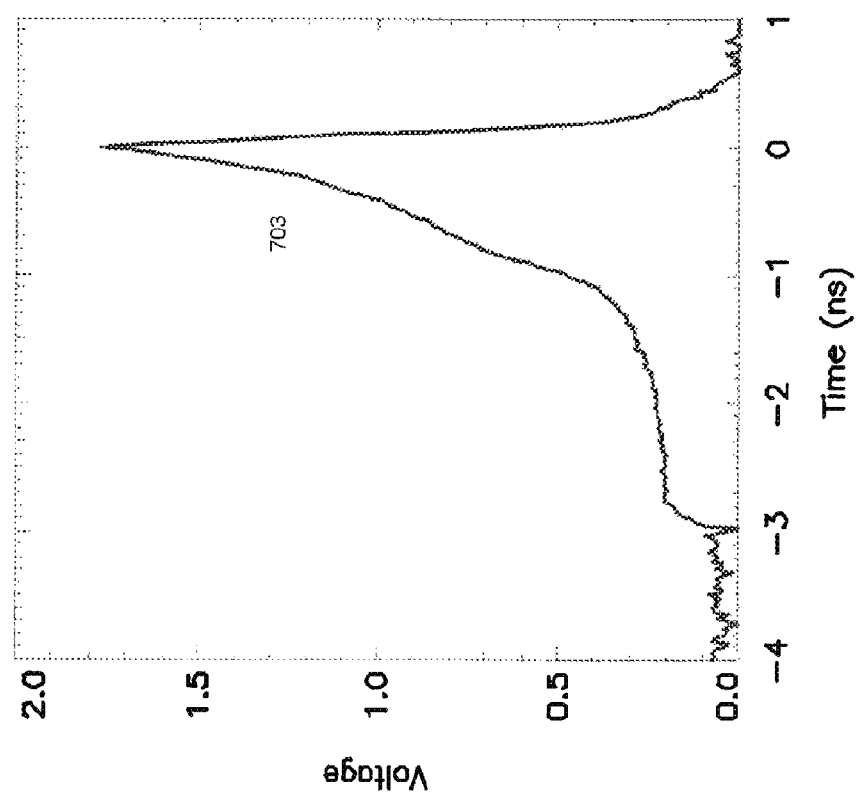
FIG. 7b is a graph that shows the inferred electrical pulse shape according to an embodiment of the invention.
Figure 7A:
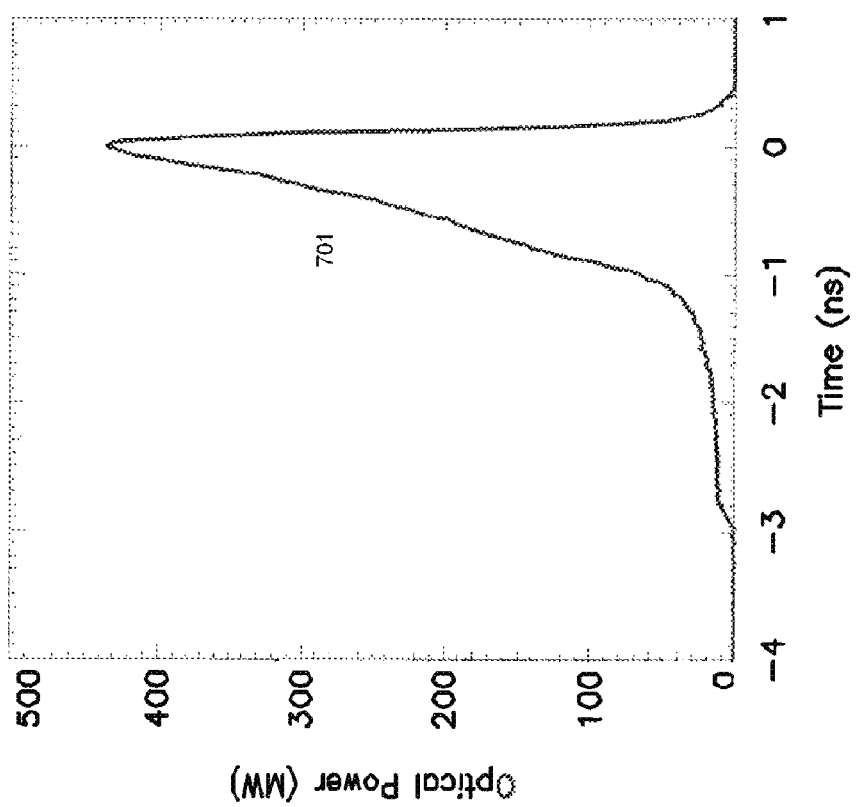
FIG. 7a is a graph that shows an optical pulse measured by the optical replicator according to an embodiment of the invention.

FIGS. 7a, 7b, respectively, show the optical pulse shape 701 measured by the optical replicator and the inferred electrical pulse shape 703 based on the inversion of the optical pulse shape, described by equation (2).

In an exemplary, cost-efficient aspect of the system 500-1, the electrical pulse detection system would use an electro-optic modulator to modulate a standard commercial laser with moderate power. If desired, part of the laser pulse could be fed into the second port of the replicator to normalize any fluctuations in the laser power. It is expected that the laser 515 supplying the photons will impose technological or cost problems that can be managed by prudently designing the system to match end users' needs. The system will typically require approximately 10 pJ of optical energy in a 5-ns window for each pulse in the replicated train. Therefore a single pulse in the train could be switched out from a 2 mW cw laser. Each replication stage requires the cw power to be multiplied by approximately a factor of two. Thus, any convenient laser or wavelength can be chosen. For example, a 200 mW, 980 nm laser would be capable of supporting approximately 100 replicas; a 20 mW, 1550 nm laser capable of supporting 8 replicas may currently be obtained for about $500 retail. The illustrative system amplifies a small number of electrons into a larger number of photons. The increase in the number of detected particles may result in improved SNR by a factor of three to ten times.

Figure 6:
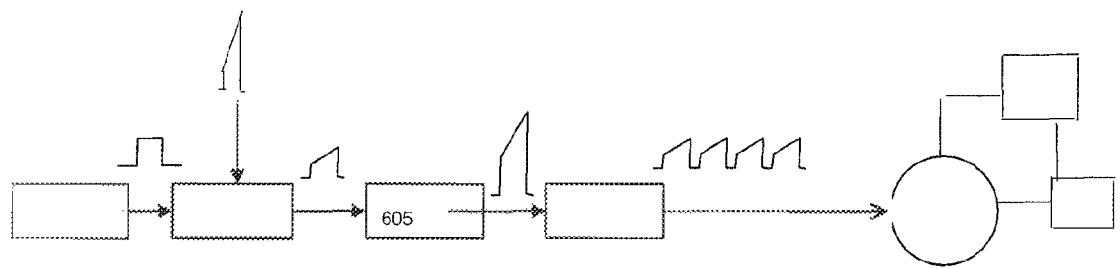
FIG. 6 shows a schematic of a pulse measurement system for measuring an electrical input pulse shape according to an alternative exemplary embodiment of the invention.

FIG. 6 schematically shows another exemplary electrical pulse shape measurement system 600-1. The system is similar to system 500-1 of FIG. 5 except that the system 600-1 further includes pulse amplifier 605. Such a system may be advantageous for applications that require the maximum enhancement in the signal to noise ratio; however, the illustrative amplified system provided more that 1000 times the optical energy needed for the optical replicator. Large optical energies can be obtained because the modulator, which has a low damage threshold, is placed before the amplifier. The system also requires the application of two inverse transfer functions (i.e., one for the modulator and one for the amplifier) to reconstruct the electrical signal shape. This makes the system more expensive and more complex to operate that exemplary system 500-1.

It will be appreciated by a person skilled in the art that it may be advantageous, according to the various embodiments and aspects described herein, to do one or more the following:

roughly determine the characteristics of the pulse (possibly using the oscilloscope and photodiode used for the replicated measurement);

determine whether the energy of the optical pulse exceeds either the damage or nonlinear propagation threshold of the fiber optic components and, if it does, to attenuate the optical pulse;

determine if there is sufficient optical energy to provide enough energy in each replicated pulse give the maximum single-pulse SNR at the detector and, if not, remove replication stages;

determine if the input electrical pulse voltage exceeds the damage threshold of the of electro-optic modulator and, if it does, attenuate the electrical pulse;

determine if the input electrical pulse voltage exceeds $V_\pi$ of the modulator and, if it does, attenuate the electrical pulse;

adjust the DC bias voltage on the modular to produce the minimum transmission through the modulator.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

We Claim:

1. A method for measuring a pulse shape, comprising:
    a) generating an optical pulse to be measured from an electrical input pulse;
    b) passively replicating the pulse, including:
        b1) in a first splitting operation, splitting the pulse amplitude into a first part and a second part;
        b2) delaying one of the first and second parts with respect to the other part by a known temporal duration;
        b3) recombining the first and second parts;
    c) repeating steps b1-b3;
    d) acquiring a resultant pulse train of all replicated pulses, further comprising acquiring the entire waveform of each replicated pulse at a different time;
    e) temporally stacking the replicated pulses;
    f) temporally aligning the stacked pulses;
    g) obtaining an average pulse shape of the temporally aligned, replicated pulses; and
    h) generating an output optical pulse shape.

2. The method of claim 1, wherein generating a pulse comprises providing a pulse having a pulse length that is less than the minimum separation between the replicated pulses in the pulse train.

3. The method of claim 1, further comprising:
    generating an optical pulse having a known polarization;
    encoding the temporal shape of the electrical pulse into the polarization of the optical pulse;
    converting the polarization encoding into an intensity coding; and
    performing steps (b-h).

4. The method of claim 1, wherein the step of temporally aligning the stacked pulses comprises one of using a fixed-offset and a cross-correlation.

5. The method of claim 1, wherein the step of passively replicating the pulse comprises replicating between $2^3$ to $2^{14}$ pulses.

6. A method for increasing the dynamic range of a pulse measurement by a repetitively-gated electronic sampling device having a rated dynamic range capability, beyond the rated dynamic range of the sampling device, comprising:

passively time-delay-replicating a pulse to be measured so as to obtain a replicated pulse train, wherein the pulse to be measured has a pulse length that is less than the minimum separation between the replicated pulses in the pulse train;

inputting the pulse train to the repetitively-gated electronic sampling device and acquiring it in a digital electronic format;

separating and temporally aligning the replica pulses in the pulse train;

averaging the temporally aligned replica pulses; and generating an output pulse shape.

7. The method of claim 6, comprising passively time-delay-replicating between $2^3$ to $2^{14}$ pulses.

8. The method of claim 6, wherein the pulse to be measured is an optical pulse.

9. The method of claim 6, wherein the pulse to be measured is an electrical pulse.

10. The method of claim 9, comprising converting the electrical pulse to an optical pulse prior to replicating the pulse.

11. The method of claim 10, comprising electro-optically modulating the electrical pulse.

12. A pulse measuring system that measures a characteristic of an input pulse under test, comprising:

a passive pulse replicator including a plurality of stages, having an input port in a first stage and an output port in a last stage, and a time delay component operatively coupled with each stage, wherein each successive stage introduces a fixed time delay to the input pulse under test, further wherein a train of time-delayed replica pulses is provided at the output port;

a repetitively-gated electronic sampling apparatus coupled to the output port, wherein the sampling apparatus acquires the pulse train including an entire waveform of each replica pulse;

a processor operatively coupled to the sampling apparatus configured to temporally align the replicated pulses; and an averager operatively coupled to at least one of the sampling apparatus and the processor, which temporally averages the replicated pulses.

13. The pulse measuring system of claim 12, wherein each stage of the passive pulse replicator includes a 2×2 fused-fiber splitter.

14. The pulse measuring system of claim 12, wherein each respective time delay component comprises a length of fiber.

15. The pulse measuring system of claim 14, wherein each length of fiber has a different length.

16. The pulse measuring system of claim 12, wherein the repetitively-gated electronic sampling apparatus is a digital storage oscilloscope.

17. The pulse measuring system of claim 12, wherein the processor is configured to, at least one of, provide a fixed-offset and perform a cross-correlation to temporally align the replicated pulses.

18. The pulse measuring system of claim 12, comprising at least three stages.

19. The pulse measuring system of claim 12, comprising a plurality of interstage connectors, wherein a stage can be added or removed from the replicator.

20. The pulse measuring system of claim 12, comprising an input pulse attenuator.

21. The pulse measuring system of claim 12, wherein the train of time-delayed replica pulses is between $2^3$ to $2^{14}$ pulses.

22. The pulse measuring system of claim 21, wherein the train of time-delayed replica pulses has a minimum inter-pulse separation, further wherein the input pulse has a pulse length that is less than the minimum inter-pulse separation.

23. The pulse measuring system of claim 12, wherein each of the first stage and the last stage has a second input port and a second output port, respectively.

24. The pulse measuring system of claim 12, wherein the input pulse is an optical pulse.

25. The pulse measuring system of claim 12, wherein the input pulse under test is an electrical pulse.

26. The pulse measuring system of claim 25, further comprising:

a laser adapted to output an optical pulse having a known polarization;

an electro-optic modulator that converts the input electrical pulse into an input optical pulse, having at least one input port to receive the optical pulse and the input electrical pulse under test, a known modulator transfer function, and an output operatively coupled to the input of the replicator.

27. The pulse measuring system of claim 26, further comprising an electrical input pulse attenuator.

28. The pulse measuring system of claim 26, further comprising a pulse amplifier having a known amplifier transfer function disposed intermediate the modulator and the replicator.

29. The pulse measuring system of claim 26, wherein the electro-optic modulator is a Mach-Zehnder polarization rotator.

* * * * *